US012796407B2

(12) United States Patent
Wen et al.

(10) Patent No.: US 12,796,407 B2
(45) Date of Patent: Nov. 10, 2026

(54) VOLTAGE CONTRAST PROCESS MONITOR

(71) Applicant: Intel Foundry IP LLC, Santa Clara, CA (US)

(72) Inventors: Xiao Wen, Beaverton, OR (US); Dipto Thakurta, Portland, OR (US); Sairam Subramanian, Portland, OR (US); David Sanchez, Portland, OR (US); Amit Paliwal, Hillsboro, OR (US)

(73) Assignee: Intel Foundry IP LLC, Santa Clara, CA (US)

( * ) Notice: Subject to any disclaimer, the term of this patent is extended or adjusted under 35 U.S.C. 154(b) by 0 days.

(21) Appl. No.: 17/958,281

(22) Filed: Sep. 30, 2022

(65) Prior Publication Data

US 2024/0112962 A1 Apr. 4, 2024

(51) Int. Cl.

| | |
|---|---|
| ***H10P 74/00*** | (2026.01) |
| ***G01R 31/52*** | (2020.01) |
| *G01R 31/54* | (2020.01) |

(52) U.S. Cl.

CPC ............ *H10P 74/273* (2026.01); *G01R 31/52* (2020.01); *G01R 31/54* (2020.01)

(58) Field of Classification Search

CPC ....... H10P 74/273; G01R 31/52; G01R 31/54; H01L 22/30; H01L 22/34

See application file for complete search history.

(56) References Cited

U.S. PATENT DOCUMENTS

2019/0384185 A1* 12/2019 Lo ............................ G03F 1/44

* cited by examiner

*Primary Examiner* — Fernando L Toledo

*Assistant Examiner* — Jorge Andres Lopez

(74) *Attorney, Agent, or Firm* — Schwabe, Williamson & Wyatt, P.C.

(57) ABSTRACT

Embodiments disclosed herein include an apparatus for alignment detection. In an embodiment, the apparatus comprises a substrate, and a plurality of devices on the substrate, where each of the plurality of devices comprises a process monitor structure with different offsets from a target value. In an embodiment, a plurality of electrically conductive traces are on the substrate, where each of the plurality of electrically conductive traces has a first end and a second end opposite the first end, and where each of the plurality of electrically conductive traces is electrically coupled at the first end, respectively, with each of the plurality of devices. In an embodiment, the second end of the each of the plurality of electrical traces is within a scan area on the substrate, and where the each of the plurality of electrically conductive traces are not directly electrically coupled with each other.

22 Claims, 10 Drawing Sheets

VOLTAGE CONTRAST PROCESS MONITOR

TECHNICAL FIELD

Embodiments of the disclosure are in the field of semiconductor structures and processing and, in particular, to voltage contrast (VC) process monitors for process window data collection.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
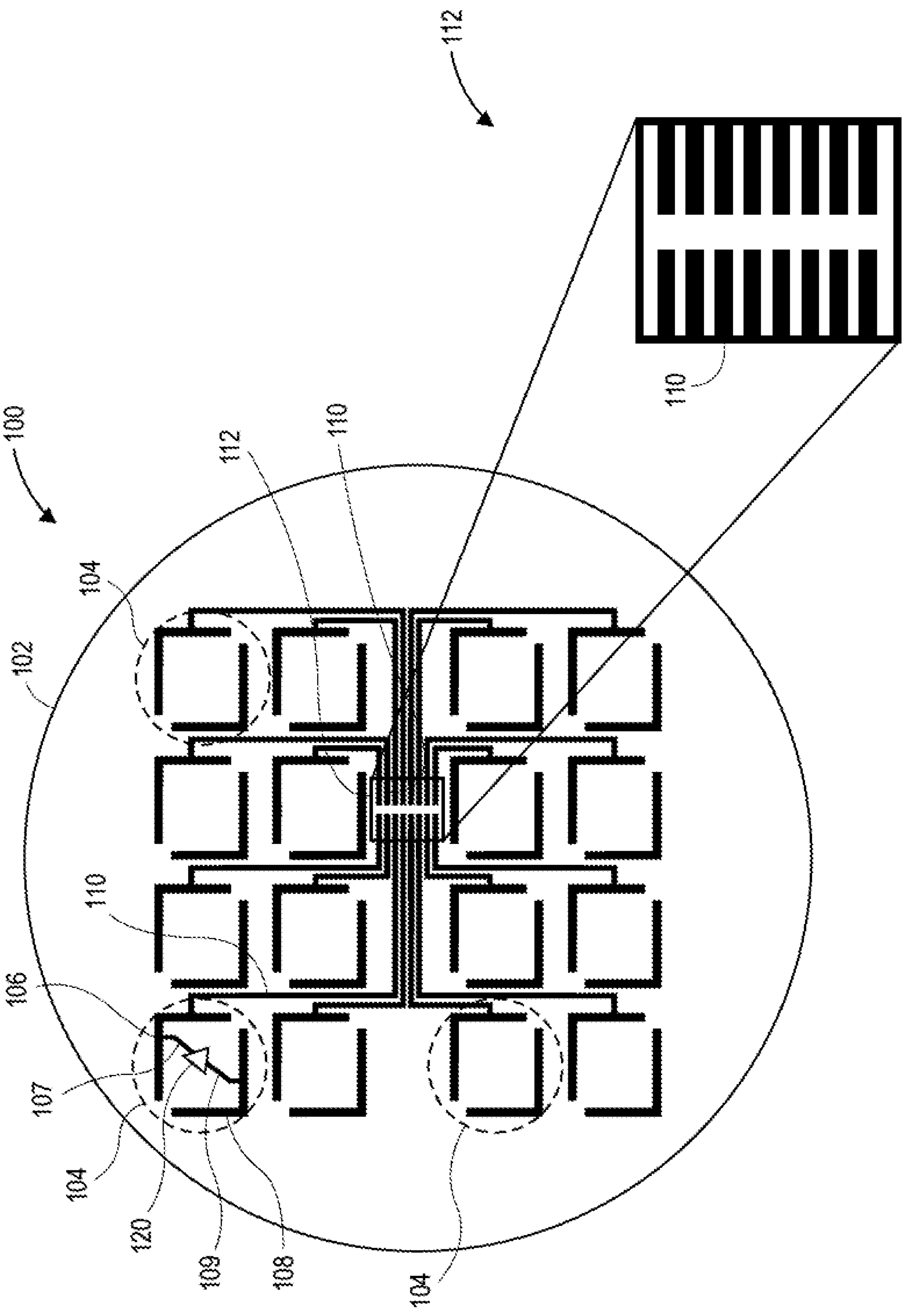
FIG. 1A is a plan view illustration of a substrate with an array of blocks with devices for measuring process windows and/or process margins, in accordance with an embodiment.

Embodiments described herein comprise voltage contrast (VC) process monitors for process window data collection. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Process windows or process margins are key parameters being monitored for process development and maintenance. Currently, electrical test process monitor structures cannot obtain enough wafer space and testing tool time for all intended process windows to be monitored in existing test chips. In some instances a scheme of sharing pads has been adopted in electric test structures to save space. Sharing pads between different test structures can cut down the pad usage up to fifty percent. Typically, process skews on critical parameters are applied in the fab, which introduces only one new process skew per wafer. However, even reducing the number of pads by fifty percent is not enough to test process margins or process windows in advanced devices. Additionally, sharing pads increases the testing time for each process margin or process window.

Accordingly, embodiments disclosed herein include process window and/or process margin testing based on voltage contrast (VC) process monitors. VC process monitor solutions enable earlier and faster data collection, as well as up to ten times better space utilization, compared to traditional electrical test process monitors.

In an embodiment, the VC process monitor combines a VC grid and an electrical test process monitor structure to collect process window data using an inline VC scan. In the layout design, electrical test process monitor structures with varying process variables are plugged into the blocks of a VC grid to enable measurement. VC process monitors save wafer space because it eliminates the need for pads used in electrical test probing. Since the data is read out by a VC inline scan, it offers earlier and faster data collection than electrical test processes. The process window data collected in a VC image may be equivalent to electrical test structures tested by up to fifty pads, so VC testing is much more time efficient. Because of the space and tool time reduction, VC process monitor solutions allow for more data collection from a single wafer.

VC process monitors may be included in various stages of production and manufacture. At a first level, VC process monitors may be present in test wafers that are used to establish process margins and process windows. In other embodiments, VC process monitors may be included in device wafers (i.e., wafers that are processed into functional integrated circuits). In such embodiments, the VC process monitors may be included in saw streets or other non-functional areas of the wafer. However, VC process monitors may persist into the final integrated circuit that is sold to the end user in some embodiments.

In an embodiment, the VC process monitors may be laid out in an array of blocks. A test structure may be provided in each block, and a signal line from each block may terminate at a central scan area. The termination of the signal line may be without a pad. That is, the signal line may terminate without contacting another electrically conductive feature. The layout of the central scan area is a column of multiple signal line ends. The process monitor structures are placed in the blocks by group. When a group of structures in neighboring blocks are investigated, it shows the same type of layout with a varying layout feature. For example, in the via chains monitoring via misregistration, the feature layout would be the shifting of vias across the blocks.

Referring now to FIG. 1A, an example of a wafer substrate that includes a plurality of devices each within a separate area on the wafer substrate, with a plurality of signal lines extending from each area to a voltage contrast scan area on the wafer substrate for testing defects in the devices is shown, in accordance with various embodiments. Diagram 100 shows a top-down view of a substrate 102, which may also be referred to as a wafer substrate, which includes a plurality of blocks 104 on a surface of the substrate 102. In embodiments, the plurality blocks 104 represent different areas on the surface of the substrate 102.

In embodiments, each of the blocks 104 may include a signal terminal 106 that is electrically coupled with a trace 110. In embodiments, each trace 110 extends from each block 104 to a scan area 112 on the surface of the substrate 102. Each trace 110 may end without contacting another electrically conductive feature. That is, each trace 110 ends in a padless configuration. In embodiments, the trace 110 may be a metal trace on a surface of the substrate 102, where the metal may include copper, aluminum, cobalt, titanium, or some other electrically conductive metal or metal alloy that may be electrically isolated from the substrate 102. In embodiments, each of the traces 110 may be electrically isolated from each other. In embodiments, each of the traces 110 may be electrically isolated from a ground of the substrate 102.

In embodiments, each block 104 may also include a ground terminal 108. In embodiments, each block 104 may contain a device 120 (represented by a triangle) where a first portion of the device 120 may be electrically coupled with the signal terminal 106 using a signal connection 107. A second portion of the device 120 may be electrically coupled with the ground terminal 108 using a ground connection 109.

In embodiments, the device 120 may be any device that may be placed on the substrate 102 to be tested whether the device is in an open state or a short state. In embodiments, the device 120 may include but is not limited to VC structures to detect gate end-to-end shorts, contact end-to-end shorts, via opens, via to gate and via to contact shorts, metal to via opens, metal end-to-end shorts, metal side-to-side shorts, and the like.

One example of a device 120 (which will be described in greater detail below) is a pair of traces that are spaced apart by a target distance plus or minus some offset. A first trace is connected to the ground terminal 108 and a second trace is connected to the signal terminal 106. If the two traces are spaced apart from each other to form an open structure, then the signal terminal 106 will be electrically isolated from the ground terminal 108, and the trace 110 within the scan area 112 will appear dark under an e-beam scan in positive charging mode. Otherwise, if there is a short between the two traces, then the trace 110 within the scan area 112 will appear bright.

Substrate 102 includes 16 blocks 104 that are arranged in a 4×4 grid pattern, with each respective trace 110 for each block 104 ending within the scan area 112. During a VC test, the scan tool needs to only look at scan area 112 to determine the open or short status of each of the devices 120 within each of the blocks 104 on the substrate 102. In embodiments, a VC scanning electron microscopy (SEM) image may be used to capture whether the traces 110 are bright or dark. When operating positive charging mode, the SEM positively charges the metal. Grounded metal, which electrically connects to the wafer substrate ground, emits more electrons and presents a brighter image. On the other hand, floating metal, which is isolated from the ground, emits fewer electrons and looks darker. This may be used to determine the conductivity information of each of the blocks 104, and may also indicate defect information for the devices 120. Note that scan area 112 is shown in a center region of the substrate 102. However, in other embodiments, the scan area 112 may be in any location on the substrate 102.

In embodiments as shown, a dimension of the scan area 112 may be 100 $\mu m^2$ or less, and may have a dimension of 10 μm or less on each side. In embodiments, the blocks 104 are shown as rectangular; however, the blocks 104 in other implementations may be any shape. In embodiments, a distance of the traces 110 from a block 104 to the scan area 112 may be chosen based upon resistance value of the traces, a desired contrast of the traces 110 within the scan area 112, and a resolution capability of the e-beam tools used for inspection.

Figure 1B:
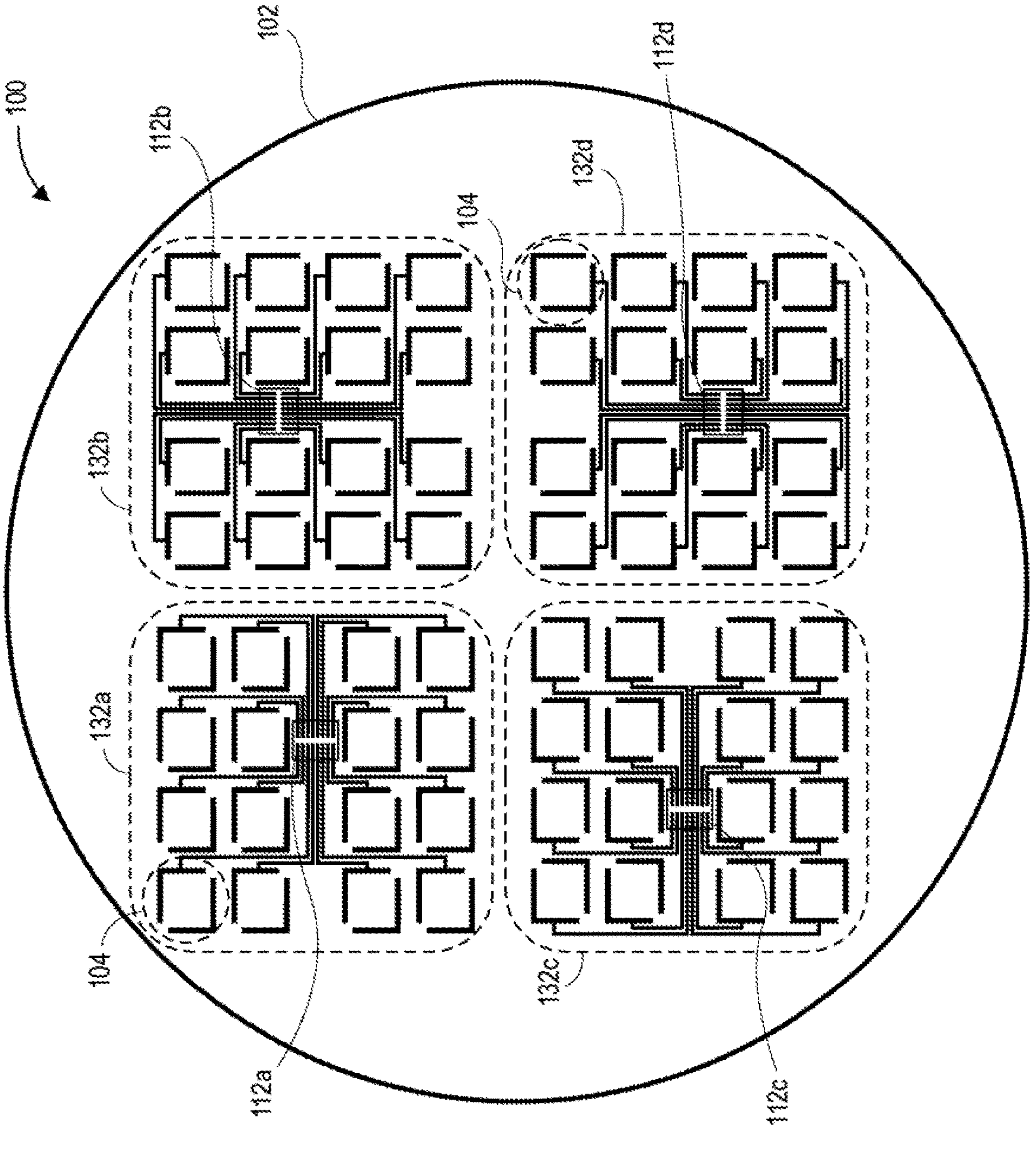
FIG. 1B is a plan view illustration of a substrate with a plurality of block arrays, in accordance with an embodiment.

Referring now to FIG. 1B, an example of a wafer that includes multiple voltage contrast scan areas on the wafer for testing various groups of devices for defects is shown, in accordance with various embodiments. The substrate 102, which may be similar to substrate 102 of FIG. 1A, includes a plurality of blocks 104, which may be similar to blocks 104 of FIG. 1A. However, as is shown, the blocks 104 may be grouped into sections 132*a*, 132*b*, 132*c*, 132*d*, with each having its own scan area 112*a*, 112*b*, 112*c*, 112*d*, respectively. In embodiments, the plurality of blocks 104 may or may not be placed next to each other. As such, embodiments enable the testing of multiple different process parameters, process windows, and/or process margins within a single substrate 102.

Figure 2A:
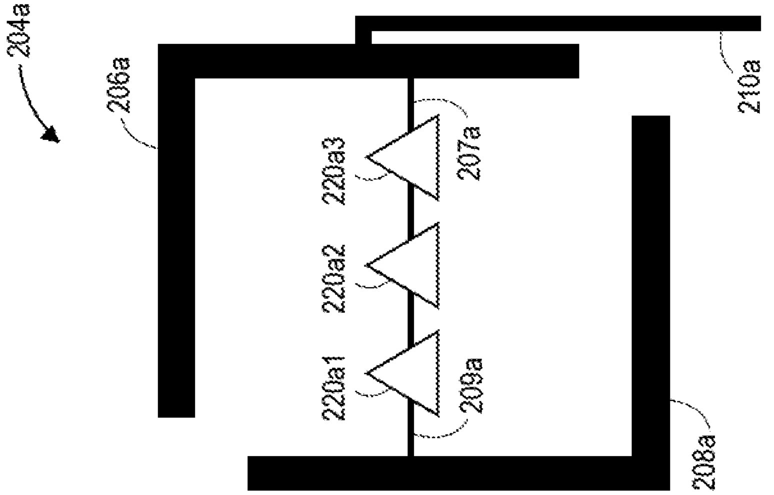
FIG. 2A is a plan view illustration of a block with three sub-devices arranged in series between a signal terminal and a ground terminal, in accordance with an embodiment.
Figure 2B:
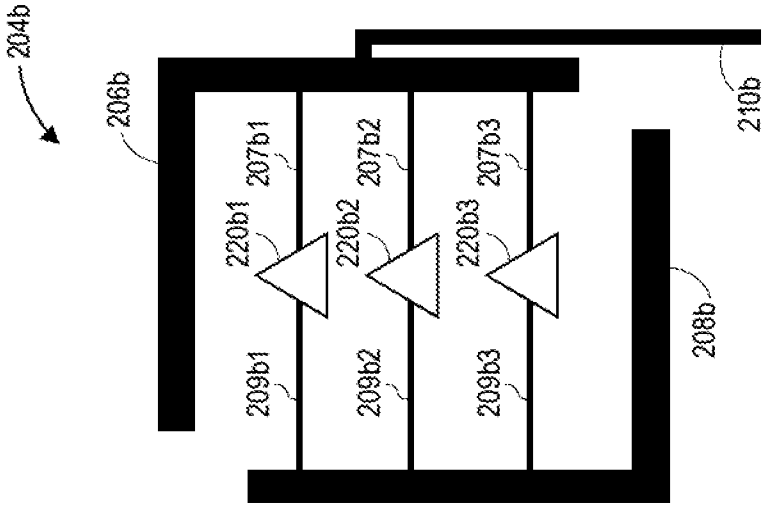
FIG. 2B is a plan view illustration of a block with three sub-devices arranged in parallel between a signal terminal and a ground terminal, in accordance with an embodiment.

FIGS. 2A and 2B illustrate examples of multiple devices within an area on the wafer that may be electrically coupled in series or in parallel for testing defects in the multiple devices, in accordance with various embodiments. In these embodiments, multiple devices, or multiple VC structures, may appear in a block.

Referring now to FIG. 2A, a block 204*a*, which may be similar to block 104 of FIG. 1A, which includes a signal terminal 206*a* that is coupled with a trace 210*a* is shown, in accordance with an embodiment. Three devices 220*a*1, 220*a*2, 220*a*3 are connected in series. The first device 220*a*1 may be coupled with a ground terminal 208*a* using ground connection 209*a*, and the third device 220*a*3 may be coupled with the signal terminal 206*a* using signal connection 207*a*. Thus, the combination of the three devices 220*a*1, 220*a*2, 220*a*3, may in effect form a larger test structure. In this configuration, each of the three devices 220*a*1, 220*a*2, 220*a*3 need to be short, for example not electrically open, in order for the trace 210*a* to appear bright within the scan area, which may be similar to scan area 112 of FIG. 1A. In embodiments, if any one of the three devices 220*a*1, 220*a*2, 220*a*3 has an electrical open, the trace 210*a* would appear dark.

Referring now to FIG. 2B, a block 204*b*, which may be similar to block 104 of FIG. 1A, which includes a signal terminal 206*b* that is coupled with a trace 210*b* is shown, in accordance with an embodiment. Block 204*b* also includes a ground terminal 208*b*. Three devices 220*b*1, 220*b*2, 220*b*3 are connected in parallel. This configuration may be referred to as a comb structure. The first device 220*b*1 may be connected with the ground terminal 208*b* using ground connection 209*b*1 and connected with the signal terminal 206*b* using signal connection 207*b*1. The second device 220*b*2 may be connected with the ground terminal 208*b* using ground connection 209*b*2 and connected with the signal terminal 206*b* using signal connection 207*b*2. The third device 220*b*3 may be connected with the ground terminal 208*b* using ground connection 209*b*3 and connected with the signal terminal 206*b* using signal connection 207*b*3. In this configuration, if any of the three devices 220*b*1, 220*b*2, 220*b*3 has an electrical short, then the trace 210*b* would appear bright within the scan area (not shown, but may be similar to scan area 112 of FIG. 1A). In embodiments, all of the three devices 220*b*1, 220*b*2, 220*b*3 would need to have an open for the trace 210*b* to appear dark.

Figure 3A:
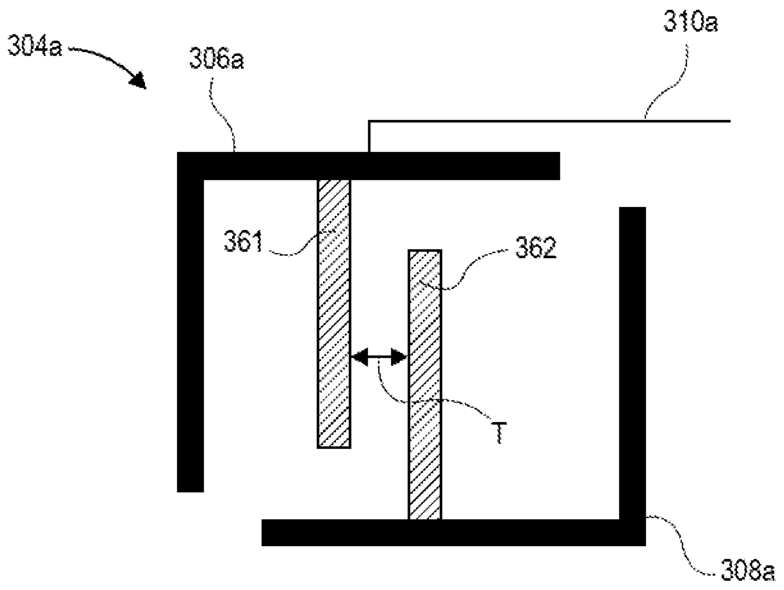
FIG. 3A is a plan view illustration of a block with a first trace spaced apart from a second trace by a target value, in accordance with an embodiment.

Referring now to FIG. 3A, a plan view illustration of a block 304*a* is shown, in accordance with an embodiment. The block 304*a* may be similar to block 104 in FIG. 1A. That is, the block 304*a* may include a signal terminal 306*a* that is connected to a trace 310*a* that is routed to a scan area (not shown). The block 304*a* may also include a ground terminal 308*a*. In an embodiment, the testing device may comprise any transistor or metal routing structure for which process window or process margin data needs to be obtained. For example, the testing device may include a first trace 361 and a second trace 362. The first trace 361 may be spaced apart from the second trace 362 by a target value T. The first trace 361 may be coupled to the signal terminal 306*a*, and the second trace 362 may be coupled to the ground terminal 308*a*. The target value T may be a value for which the expected process window would provide an open configuration for the block 304*a*. That is, there is no electrical coupling between the signal terminal 306*a* and the ground terminal 308*a*.

Figure 3B:
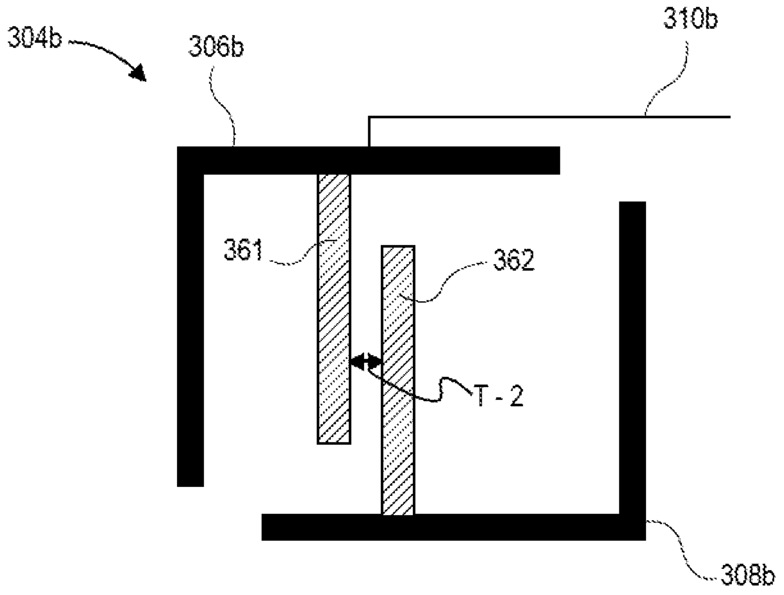
FIG. 3B is a plan view illustration of a block with a first trace that is spaced apart from a second trace by a target value minus 2 nm, in accordance with an embodiment.

Referring now to FIG. 3B, a plan view illustration of a block 304*b* is shown, in accordance with an embodiment. The block 304*b* may include a first trace 361 and a second trace 362. However, instead of a spacing T, the first trace 361 and the second trace 362 are spaced a distance T−2 (e.g., the target value *T minus* two nanometers). As shown, the reduced spacing brings the first trace 361 closer to the second trace 362, but there is still a gap between the first trace 361 and the second trace 362. This provides an open in the block 304*b* and will make the trace 310*b* dark in the scan area during VC analysis.

Figure 3C:
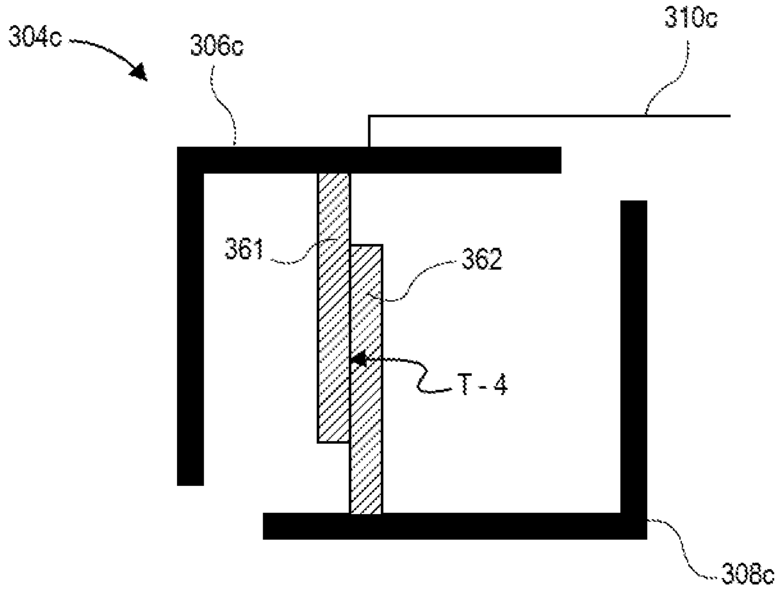
FIG. 3C is a plan view illustration of a block with a first trace that is spaced apart from a second trace by a target value minus 4 nm, in accordance with an embodiment.

Referring now to FIG. 3C, a plan view illustration of a block 304*c* is shown, in accordance with an embodiment. The block 304*c* may include a first trace 361 and a second trace 362. However, instead of a spacing T, the first trace 361 and the second trace 362 are spaced a distance T−4 (e.g., the target value *T minus* four nanometers). As shown, the reduced spacing brings the first trace 361 into contact with the second trace 362. This provides a short in the block 304*c* and will make the trace 310*c* bright in the scan area during VC analysis. This can be interpreted as one end of the processing window being up to four nanometers from the target value T. By arranging a plurality of blocks with different offsets, an accurate value of the process window and/or process margin may be determined.

Figure 4:
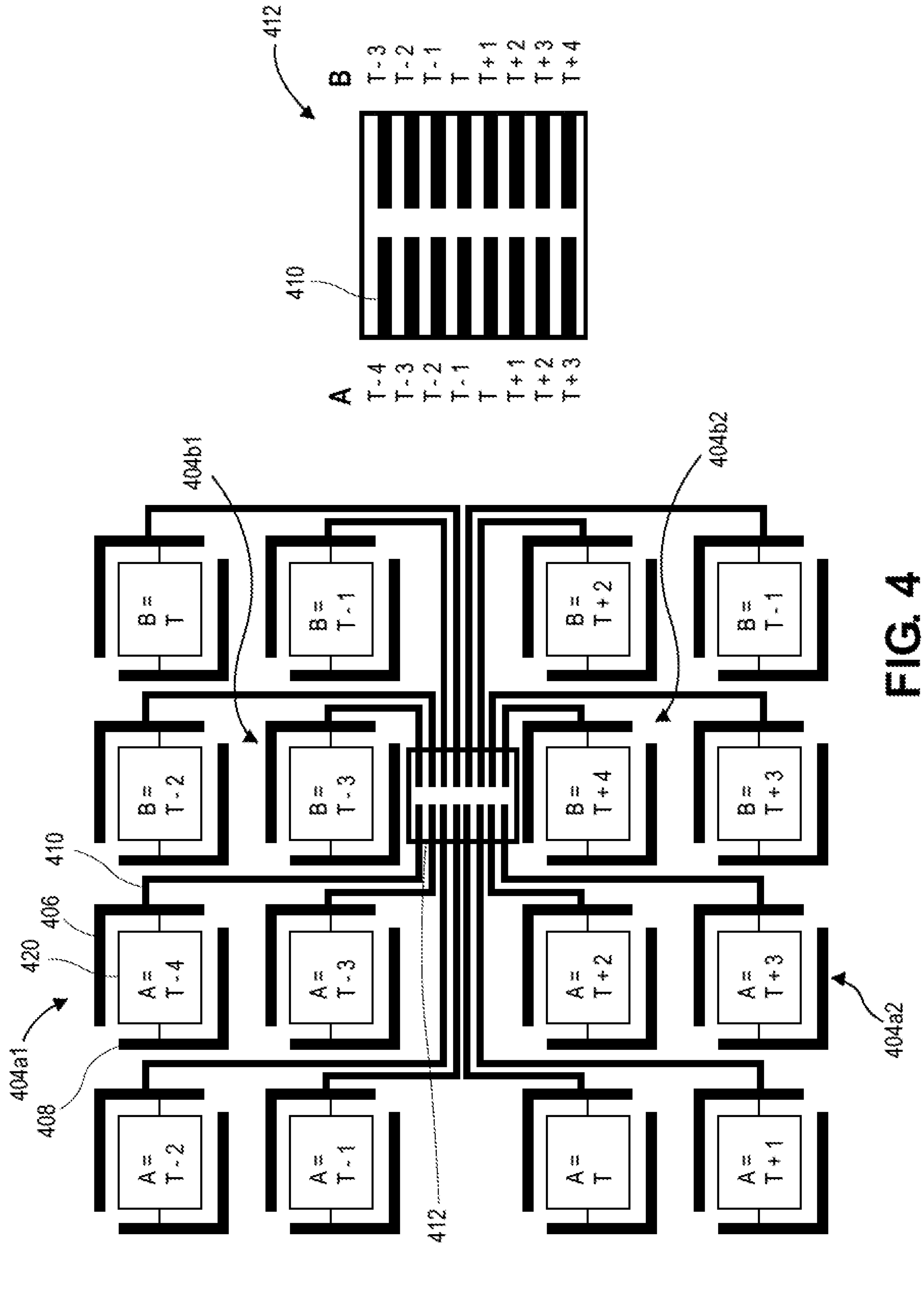
FIG. 4 is a plan view illustration of an array of blocks for determining a process window and/or process margin for two different variables, in accordance with an embodiment.

Referring now to FIG. 4, a plan view illustration of an array of blocks 404 is shown, in accordance with an embodiment. In an embodiment, the blocks 404 may be split into two different process features (A and B). The A blocks 404*a* are coupled to traces 410 in a first column of the scan area 412, and the B blocks 404*b* are coupled to traces 410 in a second column of the scan area 412. As such, a single scan can provide data for multiple different process variables.

In an embodiment, the A blocks 404*a* provide a range of offsets from T−4 (i.e., block 404*a*1) to T+3 (i.e., block 404*a*2). The blocks 404*a* may be arranged so that the traces 410 are arranged in order from T−4 to T+3. In such an embodiment, the transition between dark and light traces 410 can be used to easily depict the process window and/or process margin. Similarly, the B blocks 404*b* provide a range of offsets from T−3 (i.e., block 404*b*1) to T+4 (i.e., block 404*b*2). While referred to as target value T, it is to be appreciated that the target value T for blocks 404*b* may be different than the target value T for blocks 404*a*. The blocks 404*b* may also be arranged in order from T−3 to T+4. While eight instances of blocks 404*a* and 404*b* are provided, it is to be appreciated that larger arrays may be used in order to provide finer resolution of the process windows and/or process margins or to provide analysis of larger process windows. For example, the target value may be increased or decreased by 30 nm or more in some embodiments. For a given defect type, the process variable under test needs to set up a testing range. Ideally, the testing range covers the pass-fail transition or transitions.

Figure 5:
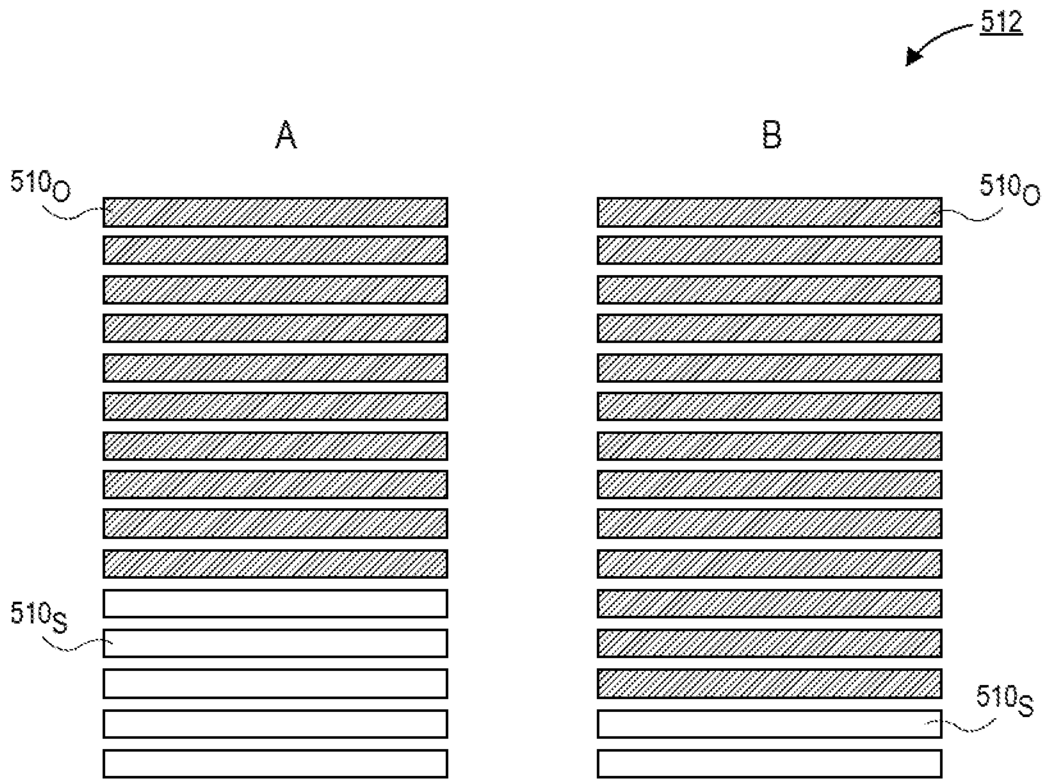
FIG. 5 is a plan view illustration of a scan area for determining a process window and/or process margin, in accordance with an embodiment.

Referring now to FIG. 5, a plan view illustration of the scan area 512 is shown, in accordance with an embodiment. In an embodiment, the scan area 512 may include A parameters in the first column and B parameters in the second column. The ordering of the traces 510 may be similar to the ordering described above with respect to FIG. 4. As shown, a first group of traces 510*o* may be dark to indicate that an open configuration is provided in the blocks 404. At some point, the dark traces 510*o* transition to light traces 510*s*. The light traces 510*s* indicate that a short is provided in the blocks 404. As such, the transition (e.g., light-to-dark or dark-to-light) can be used to indicate process margins and/or process windows. In the example shown in FIG. 5, the structures that pass the test have dark signal lines, and the bright signal lines at the bottom indicate short failures in the corresponding structures.

Figure 6:
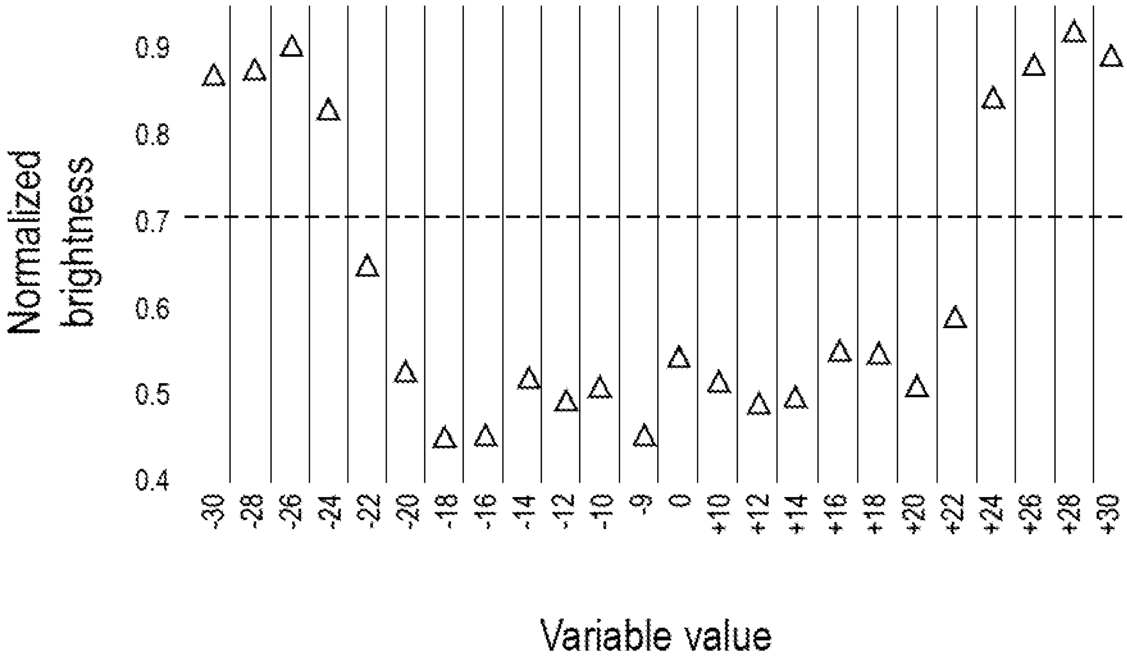
FIG. 6 is a plot of variable offset values versus normalized brightness, in accordance with an embodiment.

Referring now to FIG. 6, a graph of the VC data for an exemplary process window analysis is shown, in accordance with an embodiment. The process window and/or process margin can be identified from the plot of the VC data. The connectivity of each process monitor structure is quantified by the VC brightness data on the signal line. In the plot of VC data versus variable offset value, the process window and/or process margin can be read out by the range of variable offsets where the VC data passes a given threshold.

In the particular embodiment shown in FIG. 6, the variable under test is subjected to a range of values from T−30 nm to T+30 nm. A total of twenty four structures are tested in FIG. 6. As shown, the offsets may be non-uniform. For example, the offsets closer to zero are larger than the offsets closer to plus and minus thirty. This may be done to provide more data at the area projected to be the pass-fail boundary for a shorting mode structure. VC data for this shorting structure is low for pass and high for failure. That is, when a short occurs, the structure is deemed to have failed and is outside the process margin and/or process window.

In the embodiment illustrated in FIG. 6, a threshold of 0.7 for normalized brightness is used in order to determine the pass/fail of a device. As shown, the process window extends from −22 nm to +22 nm. The threshold can be adjusted down in order to provide a more restrictive process window and/or process margin. The range of −22 nm to +22 nm matches well with similar process windows measured by electrical test. For example, the same devices tested with electrical test structures (e.g., pads) results in a process window from −20 nm to +20 nm. Considering the difference in variable offset value intervals (e.g., smaller variable offset value intervals can be provided in VC testing) the results of VC testing and electrical testing are similar. Since VC testing allows for placing more structures than electrical testing, embodiments disclosed herein support finer granularity in testing process windows.

The data readout by VC scan does not require pads, thus, it significantly improves the space utilization compared to electrical test probing. In actual design of VC process monitors, the block dimensions which affects the dimensions of process monitor structures, and the size of the block array which relates to the number of signal lines in a row, are all adjustable. This gives freedom for designers to better utilize wafer space. For example, space utilization can be improved by a factor of ten or greater. This allows for more data to be collected per wafer.

In an embodiment, VC inline scanning can be performed after each metal polish step. Such processes enable early data collection and quick data turnaround for process window and/or process margin measurement. The centralized optical readout of the VC inline scanning also improves data collection time compared to electrical testing solutions. Furthermore, since the VC scan can be performed in a vacuum environment, the risk of oxidation is low, and there is no time limit to scan all of the needed structures in a test wafer. As such, the wafer can continue to complete subsequent processing operations.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
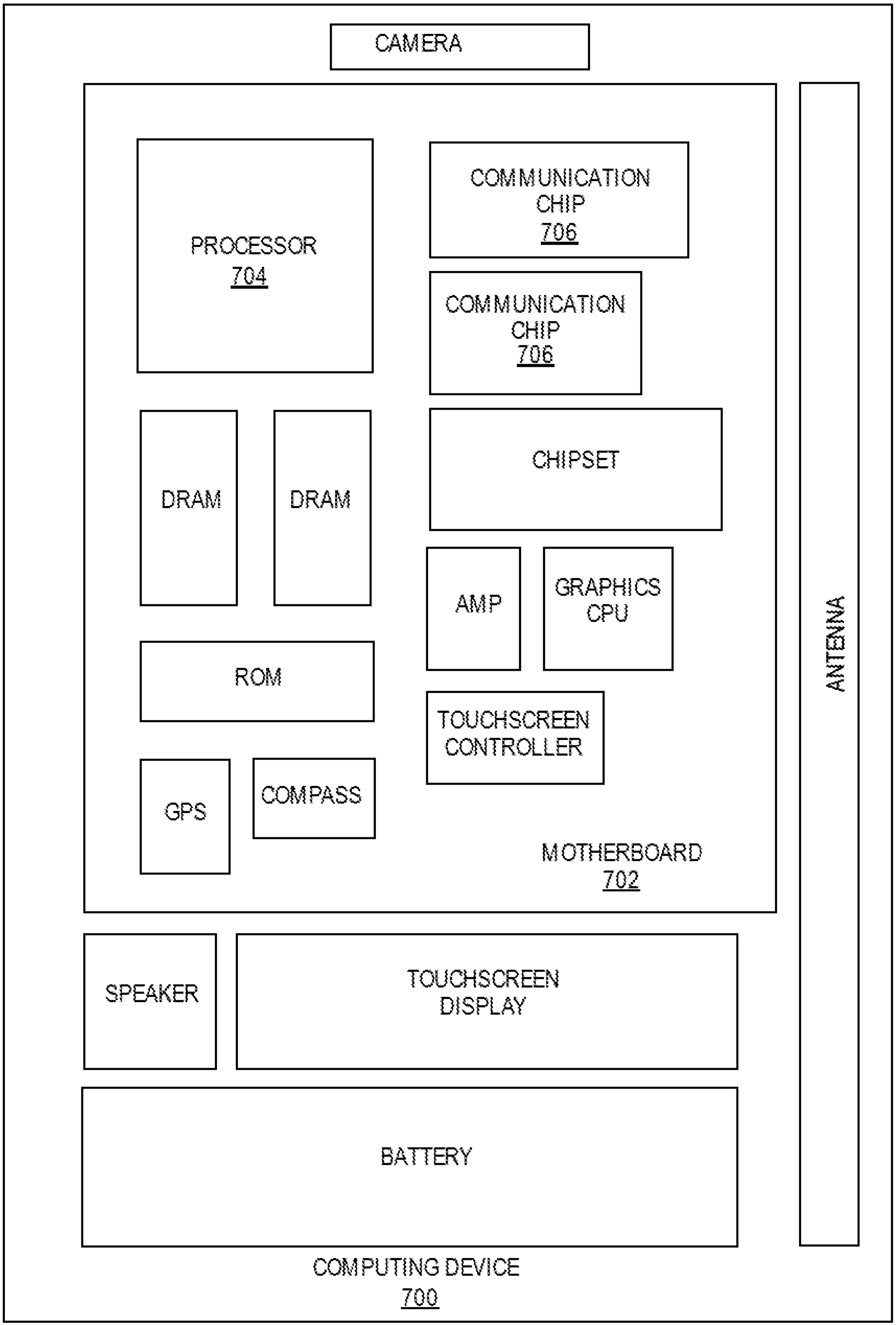
FIG. 7 illustrates a computing device in accordance with one implementation of an embodiment of the disclosure.

FIG. 7 illustrates a computing device 700 in accordance with one implementation of an embodiment of the present disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The integrated circuit die of the processor 704 may include one or more structures, such as a VC structure, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. The integrated circuit die of the communication chip 706 may include one or more structures, such as a VC structure, built in accordance with implementations of embodiments of the present disclosure.

In further implementations, another component housed within the computing device 700 may contain an integrated circuit die that includes one or structures, such as a VC structure, built in accordance with implementations of embodiments of the present disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
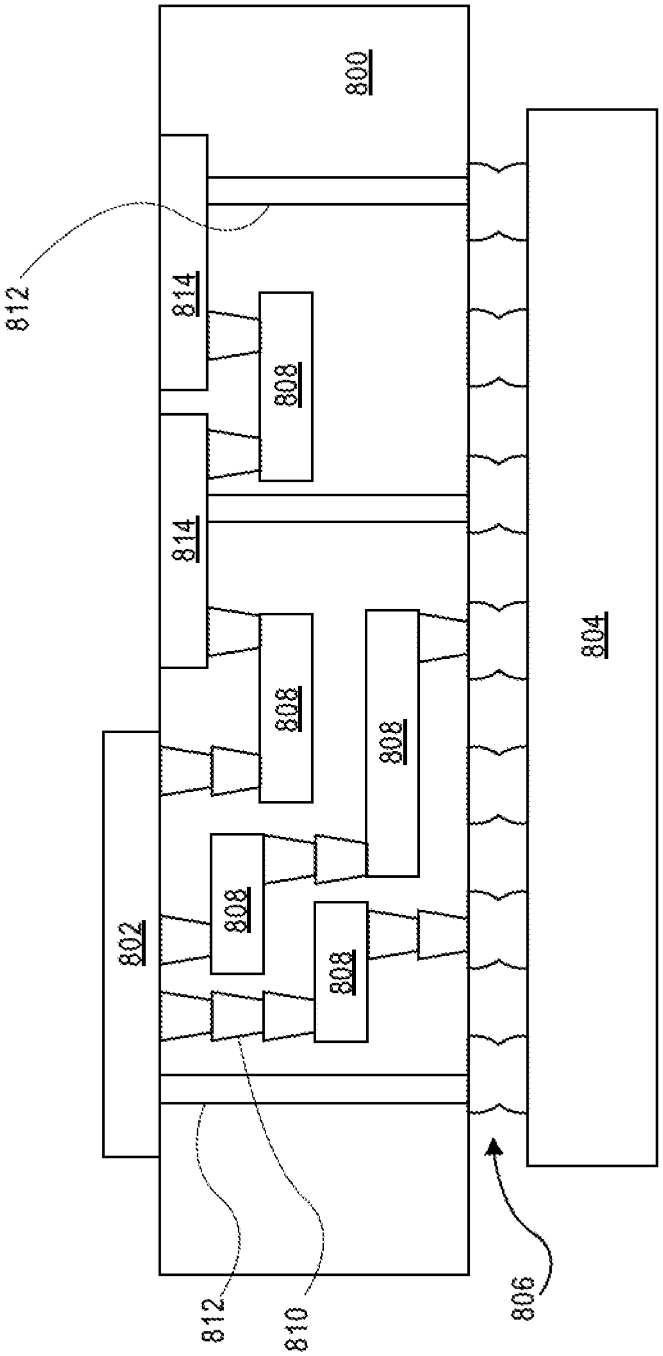
FIG. 8 illustrates an interposer that includes one or more embodiments of the disclosure.

FIG. 8 illustrates an interposer 800 that includes one or more embodiments of the present disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 808 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in the fabrication of components included in the interposer 800.

Thus, embodiments of the present disclosure include integrated circuit structures having a VC structure.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: an apparatus, comprising: a substrate; a plurality of devices on the substrate, wherein each of the plurality of devices comprises a process monitor structure with different offsets from a target value; a plurality of electrically conductive traces on the substrate, wherein each of the plurality of electrically conductive traces has a first end and a second end opposite the first end, and wherein each of the plurality of electrically conductive traces is electrically coupled at the first end, respectively, with each of the plurality of devices; wherein the second end of the each of the plurality of electrical traces is within a scan area on the substrate, and wherein the each of the plurality of electrically conductive traces are not directly electrically coupled with each other; and wherein the plurality of devices are electrically coupled with a ground.

Example 2: the apparatus of Example 1, wherein the offsets range from between plus 100 nm to minus 100 nm.

Example 3: the apparatus of Example 1 or Example 2, wherein the process monitor structures include one or more components of a transistor structure.

Example 4: the apparatus of Examples 1-3, wherein the second ends of each of the plurality of electrical traces are arranged in a column.

Example 5: the apparatus of Example 4, wherein the second ends of each of the plurality of electrical traces are arranged in order of the offsets.

Example 6: the apparatus of Examples 1-5, wherein the plurality of electrically conductive traces is a first plurality of electrically conductive traces and wherein the plurality of devices is a first plurality of devices; and further comprising: a second plurality of devices on the substrate, wherein each of the second plurality of devices comprises a second process monitor structure with different offsets from a second target value; and a second plurality of electrically conductive traces on the substrate, wherein each of the second plurality of electrically conductive traces has a first end and a second end opposite the first end, and wherein each of the second plurality of electrically conductive traces is electrically coupled at the first end, respectively, with each of the second plurality of devices; and wherein the second end of the each of the second plurality of electrical traces is within the scan area on the substrate, and wherein the each of the second plurality of electrically conductive traces are not directly electrically coupled with each other.

Example 7: the apparatus of Example 6, wherein the second ends of the each of the second plurality of electrical traces are aligned in a column.

Example 8: the apparatus of Example 6 or Example 7, wherein the second ends of the each of the second plurality of electric traces are adjacent to second ends of the each of the first plurality of electrical traces.

Example 9: the apparatus of Examples 6-8, wherein the second plurality of electrically conductive traces has the same number of electrically conductive traces as the first plurality of electrically conductive traces.

Example 10: the apparatus of Examples 6-9, wherein the second target value is different than the target value.

Example 11: the apparatus of Examples 1-10, wherein the electrically conductive traces comprise copper.

Example 12: the apparatus of Examples 1-11, wherein a first port of each of the plurality of devices is directly electrically coupled, respectively, with the first end of the each of the plurality of electrically conductive traces, and wherein a second port of each of the plurality devices is electrically coupled with the ground.

Example 13: the apparatus of Examples 1-12, wherein each of the plurality of devices further include a plurality of sub devices.

Example 14: the apparatus of Example 13, wherein a first of the each of the plurality of sub devices is electrically coupled with the ground, wherein a second of the each of the plurality of sub devices is electrically coupled with one of the plurality of electrically conductive traces, and wherein the plurality of sub devices are electrically coupled with each other in series.

Example 15: the apparatus of Example 13, wherein each of the plurality of sub devices is electrically coupled with the ground, and each of the plurality of sub devices is electrically coupled with one of the plurality of electrically conductive traces.

Example 16: the apparatus of Examples 1-15, wherein a brightness of the second end of one of the electrically conductive traces during an electronic beam scan identifies whether the device corresponding with the one of the plurality of electrically conductive traces has a short defect or an open defect.

Example 17: an apparatus, comprising: a substrate; a device on the substrate, wherein the device comprises a process monitor structure with an offset from a target value, wherein the device has a first terminal and a second terminal, and wherein the second terminal is coupled to a ground; and an electrically conductive trace with a first end and a second end opposite from the first end, wherein the first end of the electrically conductive trace is directly coupled to the first terminal of the device, and wherein the second end of the electrically conductive trace terminates without contacting another electrically conductive structure.

Example 18: the apparatus of Example 17, wherein the process monitor structure includes one or more components of a transistor structure.

Example 19: the apparatus of Example 17 or Example 18, wherein a brightness of the second end of the electrically conductive trace during an electronic beam scan identifies whether the device has a short defect or an open defect.

Example 20: the apparatus of Examples 17-19, wherein the device further includes a plurality of sub devices.

Example 21: the apparatus of Example 20, wherein a first of the plurality of sub devices is electrically coupled with the ground, wherein a second of the plurality of sub devices is electrically coupled with the electrically conductive trace, and wherein the plurality of sub devices are electrically coupled with each other in series.

Example 22: the apparatus of Example 20 or Example 21, wherein each of the plurality of sub devices is electrically coupled with the ground, and each of the plurality of sub devices is electrically coupled with the electrically conductive trace.

Example 23: a computing device, comprising; a board; and a component coupled to the board, wherein the component comprises an integrated circuit structure that comprises: a substrate; a device on the substrate, wherein the device has a first terminal and a second terminal, and wherein the second terminal is coupled to a ground; and an electrically conductive trace with a first end and a second end opposite from the first end, wherein the first end of the electrically conductive trace is directly coupled to the first terminal of the device, and wherein the second end of the electrically conductive trace terminates without contacting another electrically conductive structure.

Example 24: the computing device of Example 23, further comprising: a memory coupled to the board.

Example 25: the computing device of Example 23 or Example 24, further comprising: a communication chip coupled to the board.

What is claimed is:

1. An apparatus, comprising:

a substrate;

a plurality of devices on the substrate, wherein each of the plurality of devices comprises a process monitor structure with different offsets from a target value;

a plurality of electrically conductive traces on the substrate, wherein each of the plurality of electrically conductive traces has a first end and a second end laterally opposite the first end, and wherein each of the plurality of electrically conductive traces is electrically coupled at the first end, respectively, with each of the plurality of devices;

wherein the second end of the each of the plurality of electrical traces is within a scan area on the substrate, and wherein the each of the plurality of electrically conductive traces are not directly electrically coupled with each other; and wherein the plurality of devices are electrically coupled with a ground.

2. The apparatus of claim 1, wherein the offsets range from between plus 100 nm to minus 100 nm.

3. The apparatus of claim 1, wherein the process monitor structures include one or more components of a transistor structure.

4. The apparatus of claim 1, wherein the second ends of each of the plurality of electrical traces are arranged in a column.

5. The apparatus of claim 4, wherein the second ends of each of the plurality of electrical traces are arranged in order of the offsets.

6. The apparatus of claim 1, wherein the plurality of electrically conductive traces is a first plurality of electrically conductive traces and wherein the plurality of devices is a first plurality of devices; and further comprising:

a second plurality of devices on the substrate, wherein each of the second plurality of devices comprises a second process monitor structure with different offsets from a second target value; and a second plurality of electrically conductive traces on the substrate, wherein each of the second plurality of electrically conductive traces has a first end and a second end opposite the first end, and wherein each of the second plurality of electrically conductive traces is electrically coupled at the first end, respectively, with each of the second plurality of devices; and wherein the second end of the each of the second plurality of electrical traces is within the scan area on the substrate, and wherein the each of the second plurality of electrically conductive traces are not directly electrically coupled with each other.

7. The apparatus of claim 6, wherein the second ends of the each of the second plurality of electrical traces are aligned in a column.

8. The apparatus of claim 6, wherein the second ends of the each of the second plurality of electric traces are adjacent to second ends of the each of the first plurality of electrical traces.

9. The apparatus of claim 6, wherein the second plurality of electrically conductive traces has the same number of electrically conductive traces as the first plurality of electrically conductive traces.

10. The apparatus of claim 6, wherein the second target value is different than the target value.

11. The apparatus of claim 1, wherein the electrically conductive traces comprise copper.

12. The apparatus of claim 1, wherein a first port of each of the plurality of devices is directly electrically coupled, respectively, with the first end of the each of the plurality of electrically conductive traces, and wherein a second port of each of the plurality devices is electrically coupled with the ground.

13. The apparatus of claim 1, wherein each of the plurality of devices further include a plurality of sub devices.

14. The apparatus of claim 13, wherein a first of the each of the plurality of sub devices is electrically coupled with the ground, wherein a second of the each of the plurality of sub devices is electrically coupled with one of the plurality of electrically conductive traces, and wherein the plurality of sub devices are electrically coupled with each other in series.

15. The apparatus of claim 13, wherein each of the plurality of sub devices is electrically coupled with the ground, and each of the plurality of sub devices is electrically coupled with one of the plurality of electrically conductive traces.

16. The apparatus of claim 1, wherein a brightness of the second end of one of the electrically conductive traces during an electronic beam scan identifies whether the device corresponding with the one of the plurality of electrically conductive traces has a short defect or an open defect.

17. An apparatus, comprising:

a substrate;

a device on the substrate, wherein the device comprises a process monitor structure with an offset from a target value, wherein the device has a first terminal and a second terminal, and wherein the second terminal is coupled to a ground; and an electrically conductive trace with a first end and a second end laterally opposite from the first end, wherein the first end of the electrically conductive trace is directly coupled to the first terminal of the device, and wherein the second end of the electrically conductive trace terminates without contacting another electrically conductive structure.

18. The apparatus of claim 17, wherein the process monitor structure includes one or more components of a transistor structure.

19. The apparatus of claim 17, wherein a brightness of the second end of the electrically conductive trace during an electronic beam scan identifies whether the device has a short defect or an open defect.

20. The apparatus of claim 17, wherein the device further includes a plurality of sub devices.

21. The apparatus of claim 20, wherein a first of the plurality of sub devices is electrically coupled with the ground, wherein a second of the plurality of sub devices is electrically coupled with the electrically conductive trace, and wherein the plurality of sub devices are electrically coupled with each other in series.

22. The apparatus of claim 20, wherein each of the plurality of sub devices is electrically coupled with the ground, and each of the plurality of sub devices is electrically coupled with the electrically conductive trace.

* * * * *